United States Patent
Ozeki et al.

(10) Patent No.: US 7,211,486 B2
(45) Date of Patent: May 1, 2007

(54) METHOD OF MANUFACTURING A SEMICONDUCTOR DEVICE

(75) Inventors: Kazuyuki Ozeki, Ota (JP); Yuji Goto, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 125 days.

(21) Appl. No.: 11/175,050

(22) Filed: Jul. 6, 2005

(65) Prior Publication Data

US 2006/0008986 A1    Jan. 12, 2006

(30) Foreign Application Priority Data

Jul. 6, 2004    (JP)    .............................. 2004-198959

(51) Int. Cl.
*H01L 21/336*    (2006.01)
(52) U.S. Cl. ...................... 438/257; 438/201; 438/288; 438/573; 438/652
(58) Field of Classification Search ................ 438/257, 438/201, 238, 211, 593, 594
See application file for complete search history.

(56) References Cited

U.S. PATENT DOCUMENTS 6,727,144 B2 *    4/2004    Hashimoto .................. 438/257

2003/0235951 A1 *    12/2003    Hashimoto .................. 438/257
2004/0207004 A1 *    10/2004    Tamura ...................... 257/315

FOREIGN PATENT DOCUMENTS

JP    2003-124361    4/2003
JP    2004-200181    7/2004

* cited by examiner

*Primary Examiner*—Long K. Tran
(74) *Attorney, Agent, or Firm*—Morrison & Foerster LLP

(57) ABSTRACT

When memory cells of EEPROM and a capacitor element are formed on a same semiconductor substrate, the number of processes is prevented from increasing and a manufacturing cost is reduced. Furthermore, reliability of the capacitor element is improved, and characteristics of the memory cells, a MOS transistor, and so on are prevented from changing. A pair of left and right memory cells is formed in a memory cell formation region of a P-type silicon substrate, being symmetrical to each other with respect to a source region, and a capacitor element formed of a lower electrode, a capacitor insulation film, and an upper electrode is formed in a capacitor element formation region of the same P-type silicon substrate. The lower electrode of the capacitor element is formed by patterning a polysilicon film provided for forming control gates of the pair of memory cells.

6 Claims, 12 Drawing Sheets

METHOD OF MANUFACTURING A SEMICONDUCTOR DEVICE

CROSS-REFERENCE OF THE INVENTION

This invention is based on Japanese Patent Application No. 2004-198959, the content of which is incorporated by reference in its entirety.

BACKGROUND OF THE INVENTION

1. Field of the Invention

The invention relates to a semiconductor device manufacturing method, particularly, a method of manufacturing a semiconductor device having a nonvolatile semiconductor memory and a capacitor element.

2. Description of the Related Art

Electrically programmable and erasable read-only memories (hereafter, called EEPROM) have been widely used in the field of its application, for example, cellular phones or digital camera.

In the EEPROM, binary or multi-valued digital data can be stored according to accumulation or non-accumulation of a predetermined amount of electric charge in a floating gate, and read out by detecting conduction change in a channel region corresponding to the amount of electric charge. There are a split-gate type EEPROM and a stacked-gate type EEPROM.

FIG. 12 is a cross-sectional view showing a structure of a memory cell of the split-gate type EEPROM. A n+ drain region 102 and a n+ source region 103 are formed on a front surface of a P-type semiconductor substrate 101, keeping a predetermined distance from each other. A channel region 104 is formed between the n+ drain region 102 and the n+ source region 103. A floating gate 106 is formed on a part of the channel region 104 and a part of the source region 103 with a gate insulation film 105 therebetween. A thick silicon oxide film 107 is formed on the floating gate 106 by a selective oxidation method.

Furthermore, a tunnel insulation film 108 is formed covering a side surface of the floating gate 106 and a part of an upper surface of the thick silicon oxide film 107. A control gate 109 is formed on the tunnel insulation film 108 and a part of the channel region 104.

An operation of the memory cell having this structure is as follows. First, when digital data is written in, channel hot electrons are injected into the floating gate 106 though the gate insulation film 105 by applying predetermined potentials to the control gate 109 and the source region 103 (e.g., 0V to the P-type semiconductor substrate 101, 2V to the control gate 109, and 10V to the source region 103) and flowing a current in the channel region 104. The channel hot electrons injected into the floating gate 106 are held in the floating gate 106 as electric charge.

Since capacitor coupling of the floating gate 106 and the source region 103 is highly larger than capacitor coupling of the control gate 109 and the floating gate 106, the potential of the floating gate 106 increases by the potential applied to the source region 103, thereby improving injection efficiency of the channel hot electrons to the floating gate 106.

On the other hand, when the digital data stored in the memory cell is erased, the drain region 102 and the source region 103 are grounded and a predetermined potential (e.g., 13V) is applied to the control gate 109, thereby flowing a Fowler-Nordheim tunneling current in the tunnel insulation film 108 and taking out electrons accumulated in the floating gate 106 therefrom to the control gate 109. At this time, since a sharp edge 106a is formed in an end portion of the floating gate 106, electric field concentration occurs in this sharp edge 106a. Therefore, it is possible to flow the Fowler-Nordheim tunneling current with a relatively low control gate potential, and data erasing can be performed effectively.

Furthermore, when the data stored in the memory cell is read out, predetermine potentials (e.g., 2V) are applied to the control gate 109 and the drain region 102. Then, a channel current flows in response to the amount of charge of electrons accumulated in the floating gate 106. The data can be read out by detecting this current by a current sense amplifier.

In the described split-gate type EEPROM, programming and data erasing can be performed with high efficiency. However, for convenience of a manufacturing process, a positional relation between the control gate 109 and the floating gate 106 and a positional relation between the control gate 109 and the thick silicon oxide film 107 are not self-alignment, so that the memory cell has been required to be designed in consideration of mask shifts. Therefore, the memory cell of the split-gate type EEPROM has had limitation in miniaturization.

For solving this problem, a split-gate type EEPROM of a self-alignment type has developed. FIG. 13 is a cross-sectional view showing a memory cell of the split-gate type EEPROM of the self-alignment type. As shown in FIG. 13, a first memory cell MC1 and a second memory cell MC2 are disposed symmetrically with respect to a common source region 203 as a center.

A structure of the first memory cell MC1 is as follows (the second memory cell MC2 has the same structure). A n+ drain region 202 and a n+ source region 203 are formed on a front surface of a P-type semiconductor substrate 201, keeping a predetermined distance from each other. A channel region 204 is formed between the n+ drain region 202 and the n+ source region 203. A floating gate 206 is formed on a part of the channel region 204 and a part of the source region 203 with a gate insulation film 205 therebetween. A spacer film 207 made of silicon oxide is formed by self-alignment on this floating gate 206.

Furthermore, a tunnel insulation film 208 is formed covering a side surface and a part of an upper surface of the floating gate 206. A control gate 209 is formed by self-alignment on a sidewall of the spacer film 207. That is, the control gate 209 is disposed on the side wall of the spacer film 207 and on a part of the channel region 204.

An operation of the first memory cell MC1 is the same as that of the memory cell of the EEPROM of FIG. 12. The feature of the first memory cell MC1 and the second memory cell MC2 is that the control gate 209 is formed by self-alignment on the floating gate 206 and the spacer film 207, and the source line 210 is in contact with the source region 203 by self-alignment. In such a split-gate type EEPROM of the self-alignment type, the memory cell can be miniaturized more.

The described memory cell of the split-gate type EEPROM of the self-alignment type is described in the Japanese Patent No. 3481934 and the Japanese Patent Application Publication No. 2003-124361.

In recent years, high performance of a system LSI or a microprocessor has been realized by setting the EEPROM therein. In such a system LSI, a capacitor element for forming an analog circuit and so on has been required to be part of the system, besides the EEPROM.

However, when the EEPROM and the capacitor element are formed on the same semiconductor substrate, there occurs a problem that a manufacturing process becomes complex and a cost increases by an increase in the number of processes. Furthermore, the number of thermal treatment processes increases due to formation of the capacitor element, thereby degrading reliability of the capacitor element and changing characteristics of a memory cell, a MOS transistor, and so on.

SUMMARY OF THE INVENTION

The invention provides a method of manufacturing a semiconductor device. The method includes forming a floating gate on a semiconductor substrate so that the floating gate is insulated from the semiconductor substrate by a first insulation film, forming a tunnel insulation film to cover part of the floating gate and part of the semiconductor substrate, forming a first semiconductor film to cover the tunnel insulation film, forming a second insulation film to cover the first semiconductor film, etching the first semiconductor film and the second insulation film so as to form a lower electrode of a capacitor element and a capacitor insulation film disposed on the lower electrode and to keep the floating gate covered by the first semiconductor film, forming a second semiconductor film to cover the capacitor insulation film and part of the semiconductor substrate, etching the second semiconductor film so as to form an upper electrode disposed on the capacitor insulation film, and etching the first semiconductor film covering the floating gate electrode to form a control gate.

The invention also provides a method of forming a floating gate structure. The method includes forming an insulation film on a semiconductor substrate, forming a semiconductor film on the insulation film, forming a mask layer on the semiconductor film, forming an opening in the mask layer to expose the semiconductor film, etching the semiconductor film using the mask layer as a mask so that an undercut is formed under an edge of the opening, forming a spacer film around the edge of the opening so that the under cut is filled with the spacer film, etching the semiconductor film and the insulation film to expose the semiconductor substrate using the spacer film as a mask, removing the mask layer so as to leave the spacer film on the semiconductor film, and etching the semiconductor layer to form a floating gate using the spacer film left on the third semiconductor film as a mask.

DETAILED DESCRIPTION OF THE INVENTION

A semiconductor device manufacturing method of a first embodiment of the invention will be described with reference to drawings. In this embodiment, description will be made on the semiconductor device manufacturing method for forming memory cells of a split-gate type EEPROM of a self-alignment type and a capacitor element on the same semiconductor substrate.

Figure 1A:
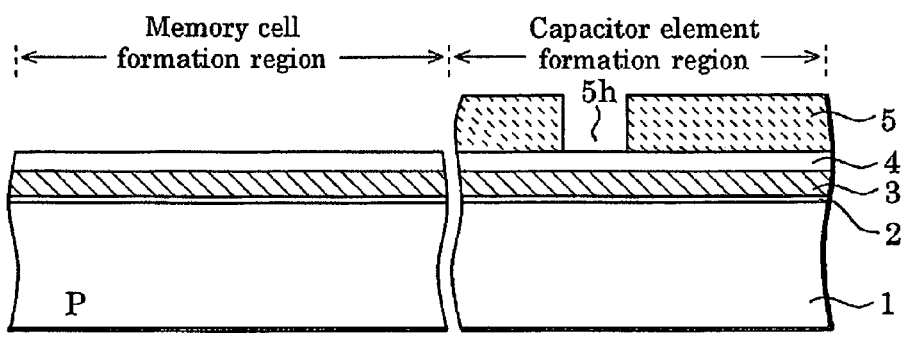
FIGS. 1A, 1B, and 1C are cross-sectional views showing a semiconductor device manufacturing method of a first embodiment of the invention.

As shown in FIG. 1A, a gate insulation film 2 made of a silicon oxide film ($SiO_2$) film having a thickness of about 10 nm is formed on a front surface of a P-type silicon substrate 1 by thermal oxidation. Then, a polysilicon film 3 having a thickness of about 50 nm and a silicon nitride film 4 having a thickness of 120 nm are formed on the gate insulation film 2 by a CVD method. Furthermore, a photoresist layer 5 having an opening 5h is formed on the silicon nitride film 4. In FIG. 1A, a left portion corresponds to a memory cell formation region, and a right portion corresponds to a capacitor element formation region. These regions are also shown in this manner in the following drawings.

Figure 1B:
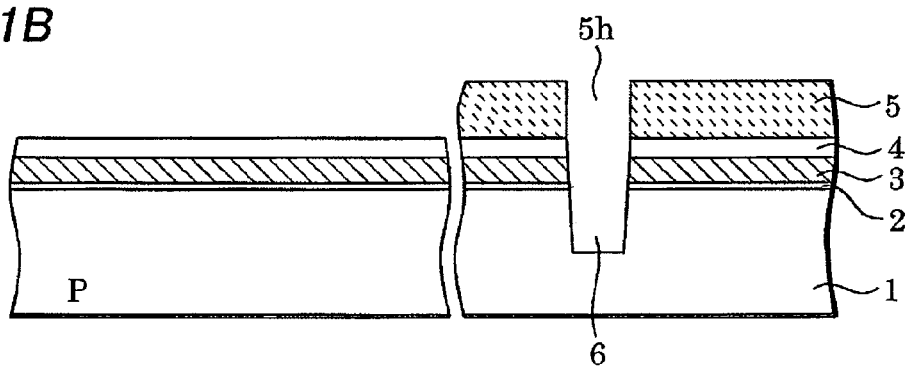

Next, as shown in FIG. 1B, by using the photoresist layer 5 having the opening 5h as a mask, the silicon nitride film 4, the polysilicon film 3, and the gate insulation film 2 exposed in the opening 5h are etched in this order, and the front surface of the P-type silicon substrate 1 is etched, thereby forming a trench 6. It is preferable that the trench 6 is 1 μm or less in depth for so-called shallow trench isolation.

Figure 1C:
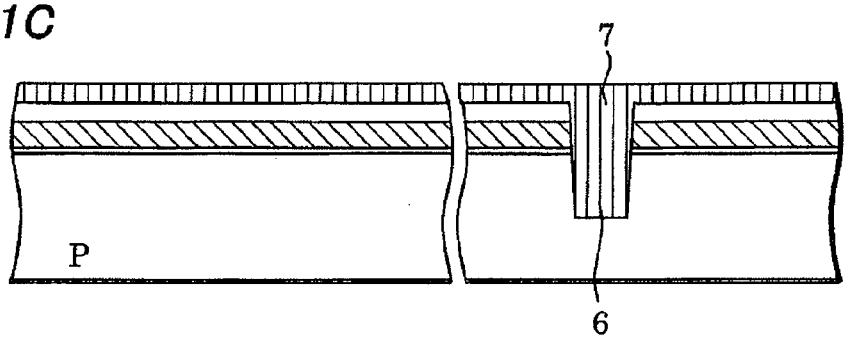
Figure 2A:
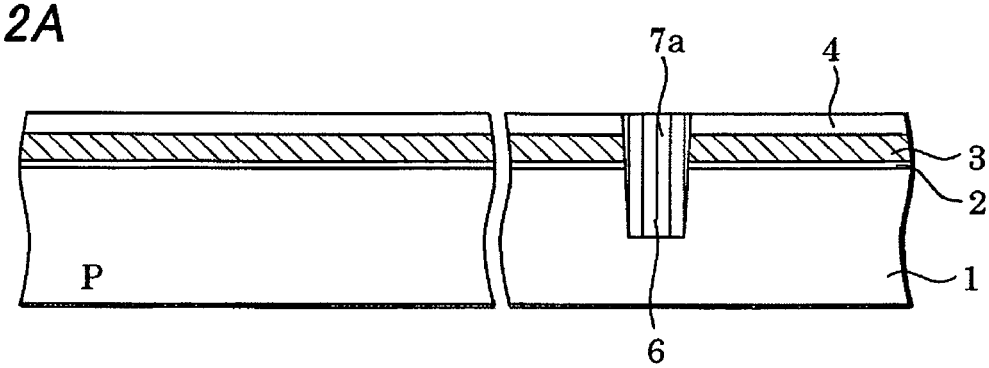
FIGS. 2A and 2B are cross-sectional views showing the semiconductor device manufacturing method of the first embodiment of the invention.
Figure 2B:
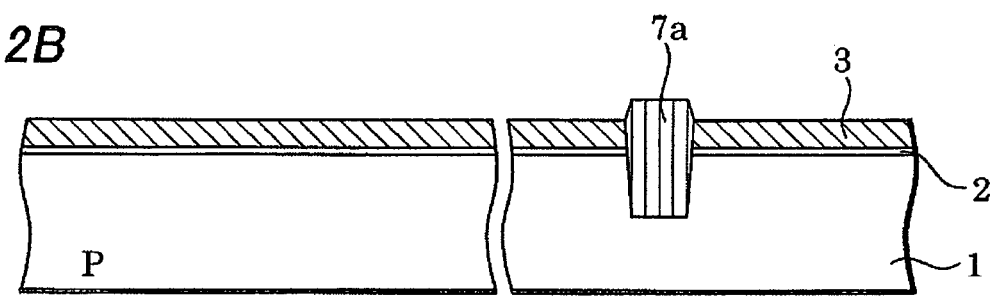

Next, as shown in FIG. 1C, a silicon oxide film (e.g., a TEOS film) 7 is formed on the whole surface including in the trench 6 by the CVD method. Then, a front surface of the silicon oxide film 7 is polished by a CMP method (a chemical mechanical polishing method) as shown in FIG. 2A. In this process, the silicon nitride film 4 functions as an endpoint detection film for the CMP, and the CMP is stopped when the silicon nitride film 4 is detected being exposed by an optical method. In this manner, a trench insulation film 7a selectively embedded in the trench 6 is formed. Then, as shown in FIG. 2B, the silicon nitride film 4 is removed using chemical such as hot phosphoric acid, and thus the shallow trench isolation structure suitable for miniaturization is formed as a device isolation structure.

Figure 3A:
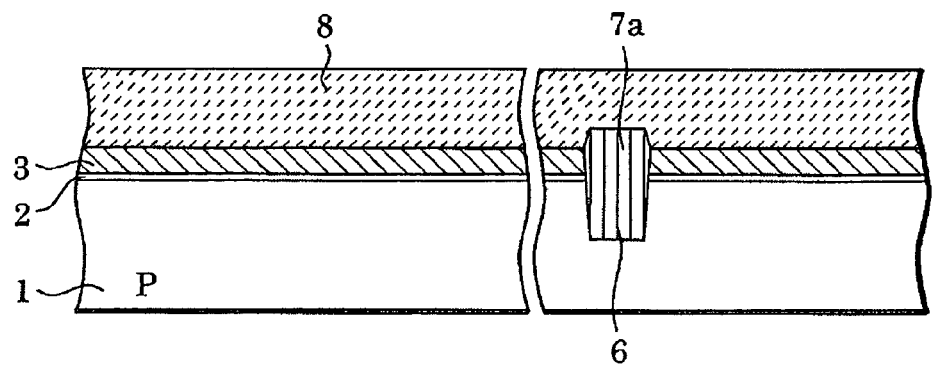
FIGS. 3A, 3B, and 3C are cross-sectional views showing the semiconductor device manufacturing method of the first embodiment of the invention.
Figure 3B:
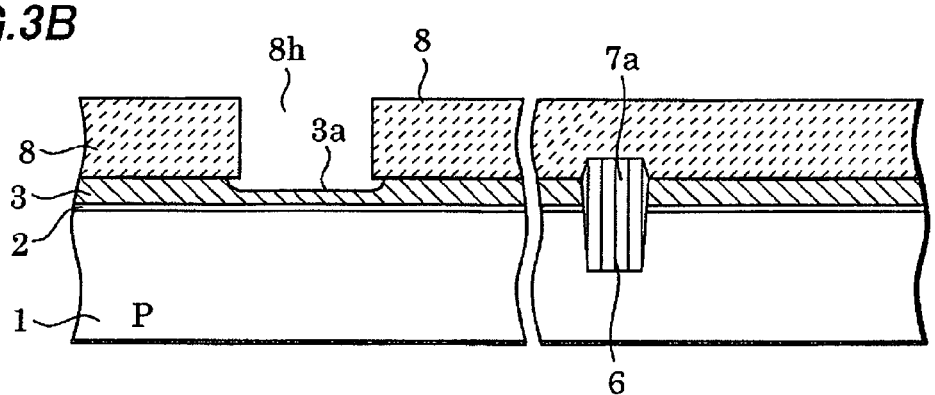
Figure 3C:
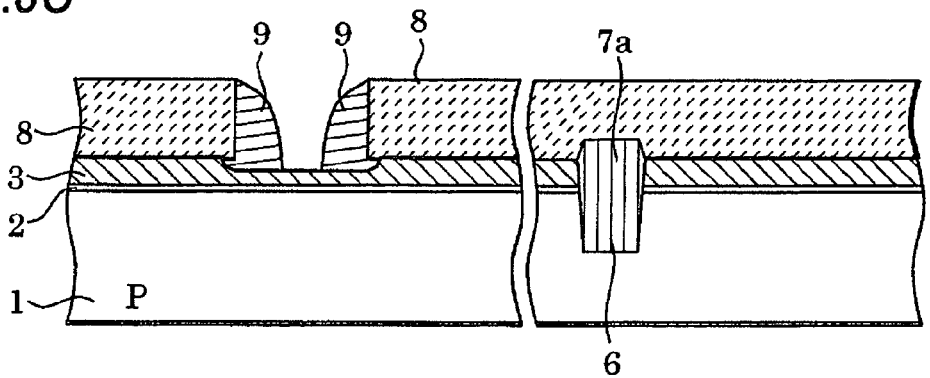

Next, as shown in FIG. 3A, a thick silicon nitride film 8 having a thickness of about 400 nm is formed on the whole surface by the CVD method. Then, as shown in FIG. 3B, the silicon nitride film 8 in the region to be formed with a floating gate afterward is selectively etched to form an opening 8h. By using this silicon nitride film 8 having the opening 8h as a mask, the front surface of the polysilicon film 3 is isotropically etched. By this process, a shallow groove 3a is formed in a front surface of the polysilicon film 3. By this isotropic etching, an undercut portion is formed under an edge of the silicon nitride film 8.

Then, a silicon oxide film is formed on the whole surface including in the opening 8h of the silicon nitride film 8 by the CVD method, and etched back by anisotropic etching. This etching back is performed until a front surface of the silicon nitride film 8 is exposed. As a result, a spacer film 9 made of a silicon oxide film is formed on a sidewall of the silicon nitride film 8.

Figure 4A:
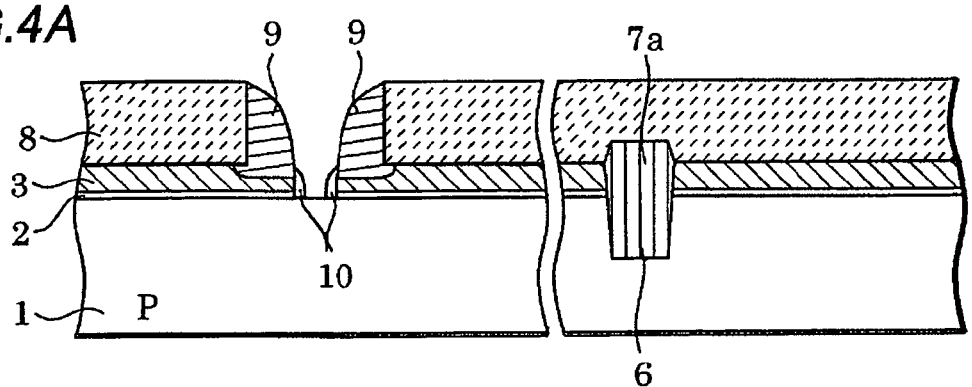
FIGS. 4A, 4B, and 4C are cross-sectional views showing the semiconductor device manufacturing method of the first embodiment of the invention.

Next, as shown in FIG. 4A, the polysilicon film 3 and the gate insulation film 2 are etched using the spacer film 9 as a mask to expose the front surface of the P-type silicon substrate 1. In this process, the sidewall of the polysilicon film 3 is exposed by etching, but this exposed sidewall of the polysilicon film 3 is covered with a side cap film 10. The side cap film 10 is formed by depositing a silicon oxide film having a thickness of about 30 nm on the whole surface by the CVD method and etching back this silicon oxide film by anisotropic etching.

Figure 4B:
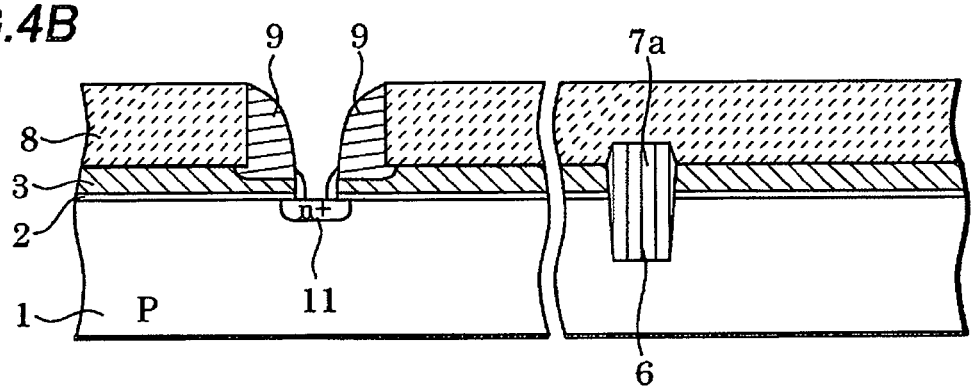

Then, n-type impurities (e.g., arsenic) are ion-injected using the spacer film 9 and the silicon nitride film 8 as a mask, thereby forming a n+ source region 11 in the front surface of the P-type silicon substrate 1 by self-alignment, as shown in FIG. 4B.

Figure 4C:
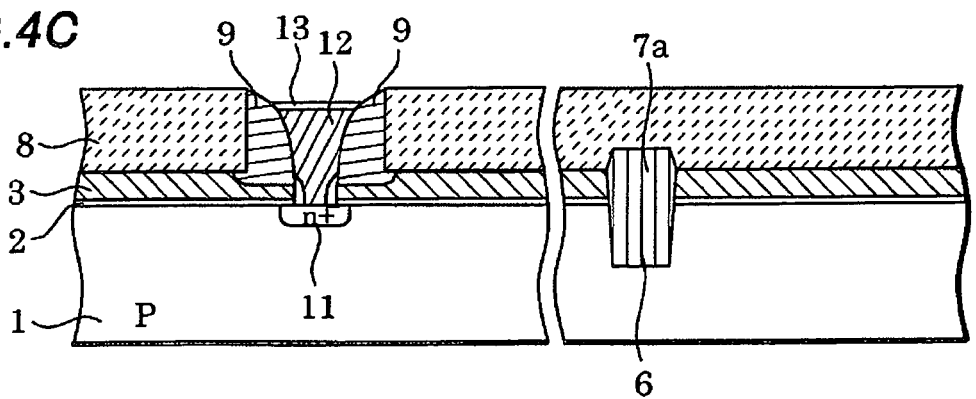

Then, as shown in FIG. 4C, a source line 12 being in contact with the source region 11 is formed in a groove surrounded by the spacer film 9 and the side cap film 10. The source line 12 is formed by depositing a polysilicon film on the whole surface by the CVD method and polishing this polysilicon film by the CMP method. At this time, the silicon nitride film 8 is used as an endpoint detection film for the CMP. An upper surface of the source line 12 is then covered with a source line cap film 13 made of a silicon oxide film.

Figure 5A:
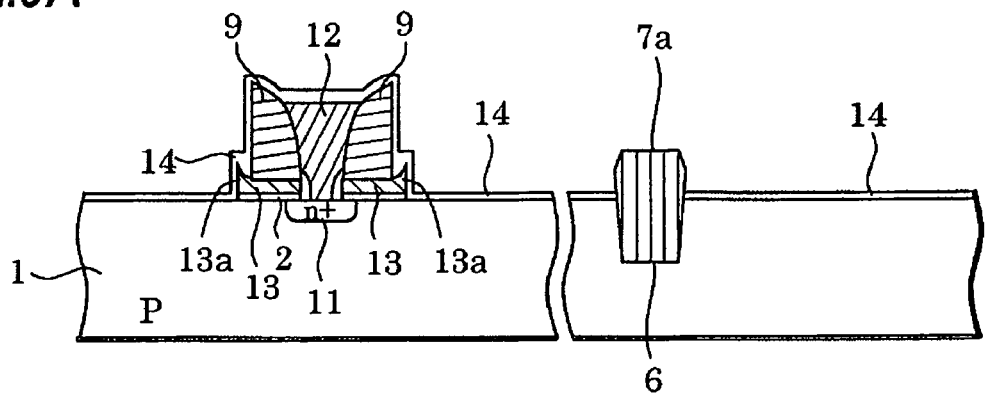
FIGS. 5A, 5B, and 5C are cross-sectional views showing the semiconductor device manufacturing method of the first embodiment of the invention.

Next, as shown in FIG. 5A, the silicon nitride film 8 is removed using chemical such as hot phosphoric acid, and the polysilicon film 3 and the gate insulation film 2 are anisotropically etched using the spacer films 9 as a mask, thereby forming a pair of floating gates 13. The floating gates 13 are formed by self-alignment on the spacer films 9. At this time, a sharp edge 13a is formed in an end portion of each of the pair of floating gates 13. The sharp edges 13a are formed because the end portion of the groove 3a is curved upward by isotropic etching for forming the shallow groove 3a. Furthermore, a tunnel insulation film 14 is formed by depositing a silicon oxide film having a thickness of about 20 nm on the whole surface by the CVD method. This tunnel insulation film 14 is formed so as to cover sidewalls and a part of upper surfaces of the floating gates 13.

Figure 5B:
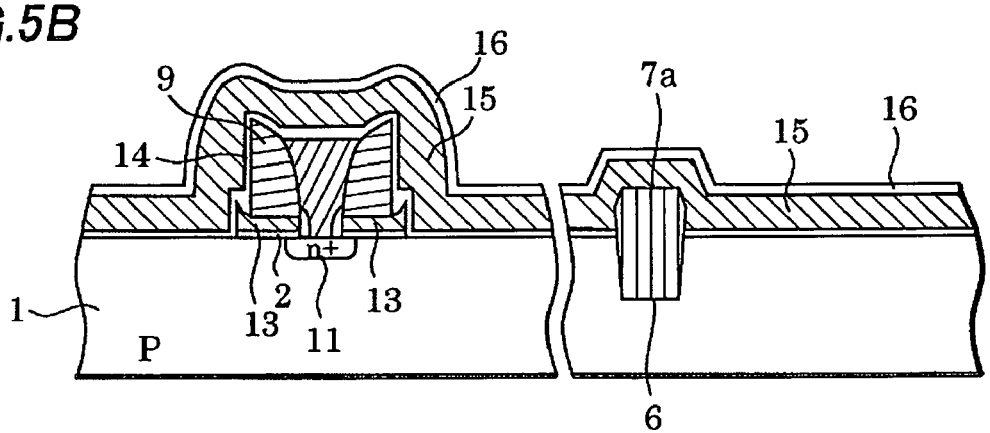

Then, as shown in FIG. 5B, a polysilicon film 15 having a thickness of about 200 nm and a silicon nitride film 16 having a thickness of about 20 nm are formed on the whole surface in this order by the CVD method. A silicon oxide film can be formed instead of the silicon nitride film 16.

Figure 5C:
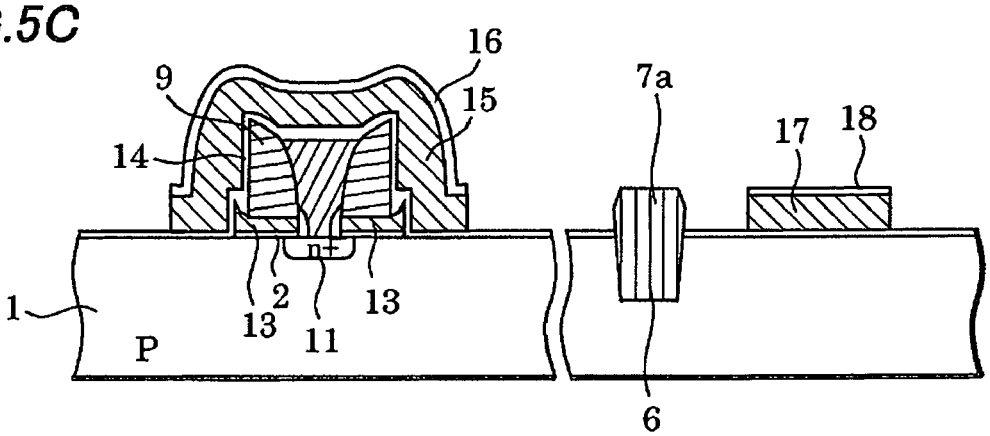

Then, as shown in FIG. 5C, the polysilicon film 15 and the silicon nitride film 16 are etched using a photoresist layer (not shown) as a mask to leave the films 15 and 16 on the spacer films 9 in the memory cell formation region so as to cover the spacer films 9 with these films 15 and 16. At the same time, a lower electrode 17 of a capacitor element, which is made of the polysilicon film 15, and a capacitor insulation film 18 made of the silicon nitride film 16 are formed in the capacitor element formation region.

Figure 6A:
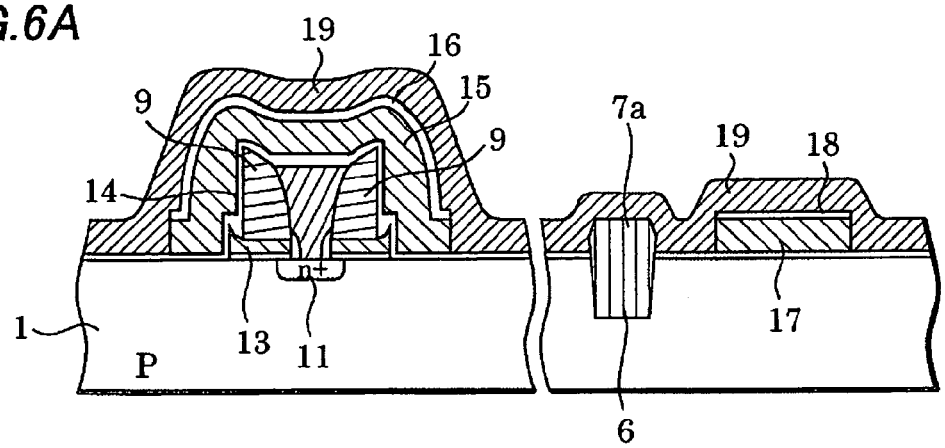
FIGS. 6A, 6B, and 6C are cross-sectional views showing the semiconductor device manufacturing method of the first embodiment of the invention.
Figure 6B:
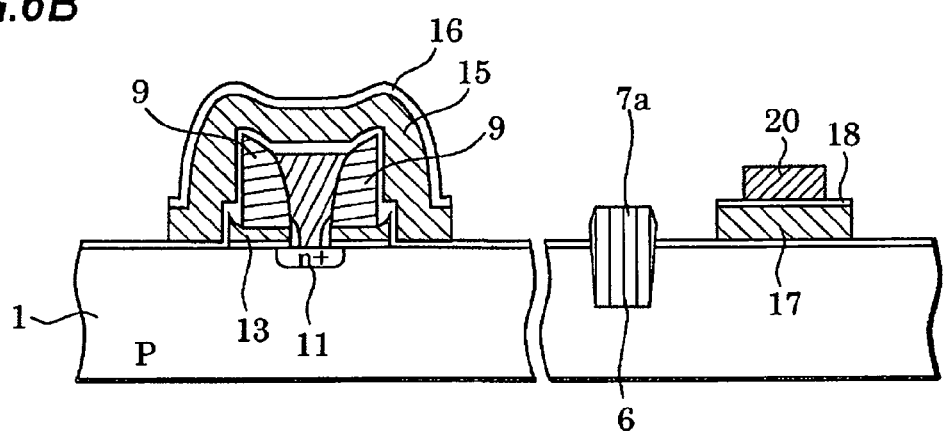

Next, a polysilicon film 19 having a thickness of about 200 nm is deposited on the whole surface by the CVD method as shown in FIG. 6A. Then, an upper electrode 20 facing the lower electrode 17 is formed on the capacitor insulation film 18 by selectively etching the polysilicon film 19 as shown in FIG. 6B. At the same time as when the polysilicon film 19 is selectively etched, a gate electrode of a MOS transistor to be formed near the memory cell formation region can be formed.

Figure 6C:
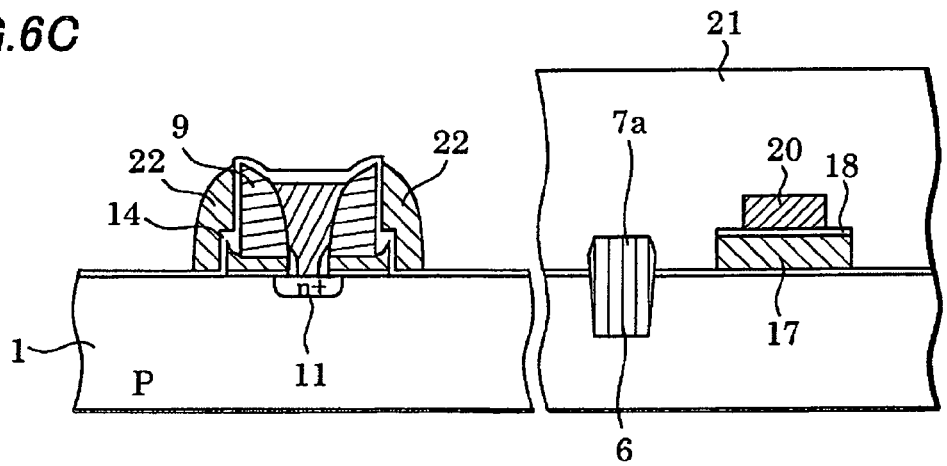

Then, as shown in FIG. 6C, with the capacitor element formation region covered with a photoresist layer 21, the polysilicon film 15 and the silicon nitride film 16 remaining in the memory cell formation region are etched back by anisotropic etching to form the control gates 22. The control gates 22 are formed by self-alignment on the sidewalls of the spacer films 9. That is, the control gates 22 are formed on the sidewalls of the spacer films 9 and on the P-type silicon substrate 1 to be channel regions.

Figure 7:
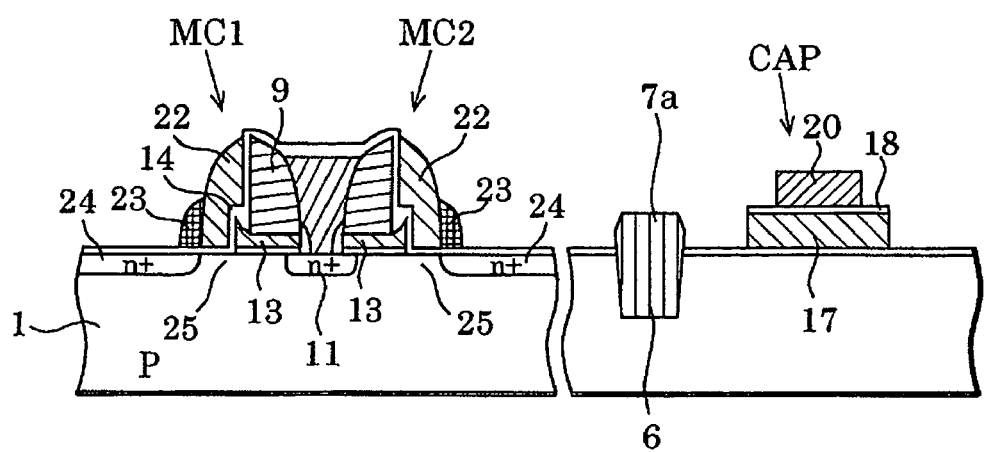
FIG. 7 is a cross-sectional view showing the semiconductor device manufacturing method of the first embodiment of the invention.

Next, as shown in FIG. 7, after the photoresist layer 21 is removed, mini spacer films 23 are formed on lower portions of sidewalls of the control gates 22. These mini spacer films 23 are formed by depositing the silicon oxide film by the CVD method and etching back the silicon oxide film. Then, n-type impurities (e.g., arsenic) are ion-injected into this memory cell formation region to form n+ drain regions 24 by self-alignment to the control gates 22. The front surface of the P-type silicon substrate 1 between the source region 11 and the drain regions 24 is to be the channel regions.

In this embodiment, the pair of left and right memory cells MC1 and MC2 is formed in the memory cell formation region of the P-type silicon substrate 1, being symmetrical to each other with respect to the source region 11, and the capacitor element CAP formed of the lower electrode 17, the capacitor insulation film 18, and the upper electrode 20 is formed in the capacitor element formation region of the same P-type silicon substrate 1. The lower electrode 17 of the capacitor element CAP is formed by patterning the polysilicon film 15 for forming the control gates 22 of the pair of memory cells MC1 and MC2, so that the manufacturing process can be reduced. Furthermore, when the diffusion layer to be the capacitor electrode is formed in the P-type silicon substrate 1 by ion-injection, thermal treatment for recovering damage caused by the ion-injection has been required. However, in this embodiment, since the capacitor element is formed of two polysilicon films, particular thermal treatment is not required, so that reliability of the capacitor element CAP can be secured enough and characteristics of the memory cells MC1 and MC2 and the MOS transistor near the MC1 and MC2 can be prevented from changing.

Next, a semiconductor device manufacturing method of a second embodiment of the invention will be described with reference to drawings. In this embodiment, descriptions will be made on the semiconductor device manufacturing method for forming memory cells of a split gate type EEPROM of a self-alignment type, a capacitor element, and a MOS transistor on a same semiconductor substrate.

Figure 8:
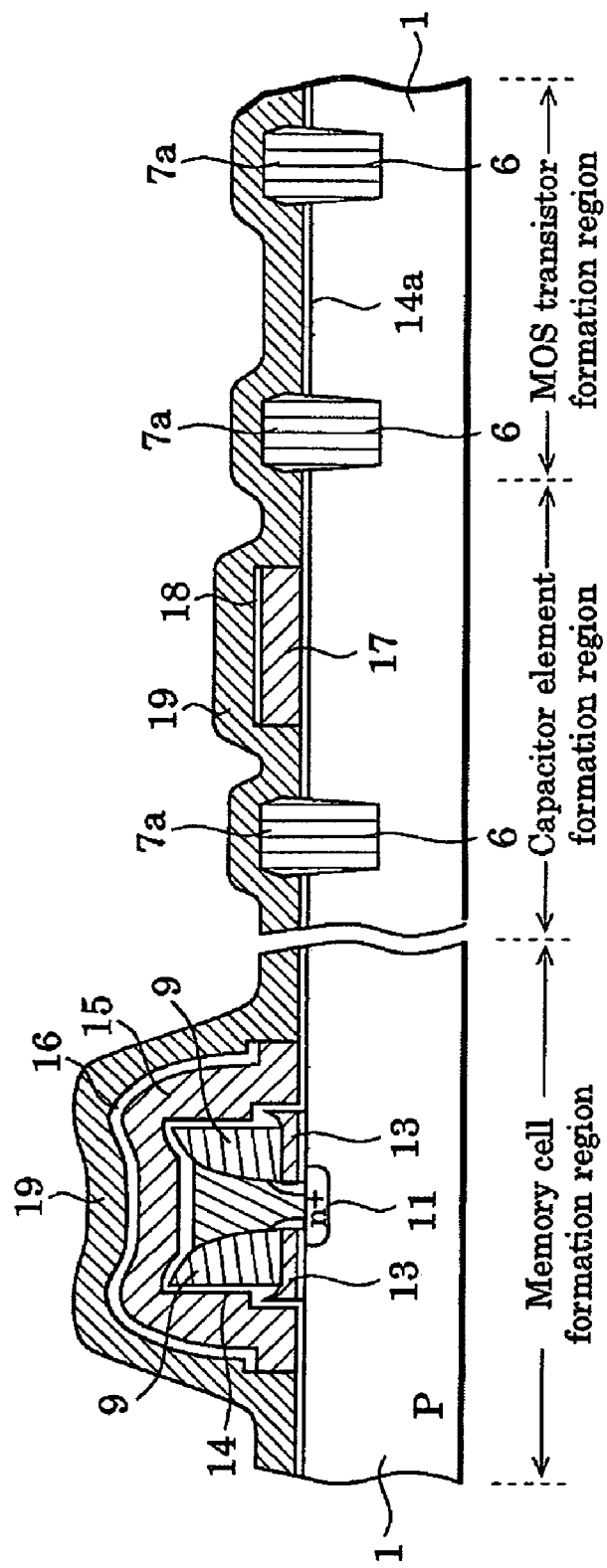
FIG. 8 is a cross-sectional view showing a semiconductor device manufacturing method of a second embodiment of the invention.

As shown in FIG. 8, a MOS transistor formation region is provided on a P-type silicon substrate 1, besides a memory cell formation region and a capacitor element formation region. The memory cell formation region and the capacitor element formation region are formed by the same method as that of the first embodiment, being in the same state as that shown in FIG. 6A. In the MOS transistor formation region, trenches 6 and trench isolation films 7a are formed by the same method as that of the first embodiment, and an insulation film formed when a tunnel insulation film 14 of the memory cell formation region is formed is also used as a gate insulation film 14a. A polysilicon film 19 covering the memory cell formation region and the capacitor element formation region also covers the MOS transistor formation region.

Figure 9:
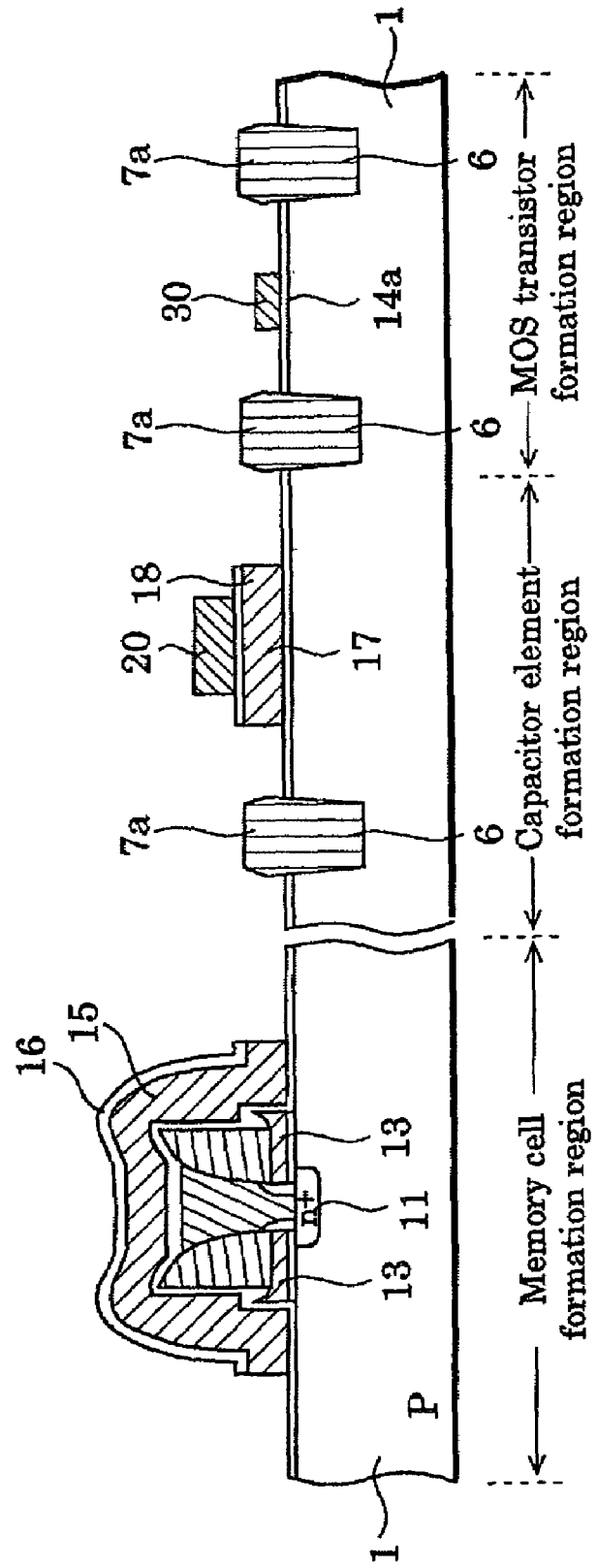
FIG. 9 is a cross-sectional view showing the semiconductor device manufacturing method of the second embodiment of the invention.

Then, as shown in FIG. 9, the polysilicon film 19 is selectively etched to form an upper electrode 20 facing a lower electrode 17 on a capacitor insulation film 18 and form a gate electrode 30 on the gate insulation film 14a in the MOS transistor formation region.

Figure 10:
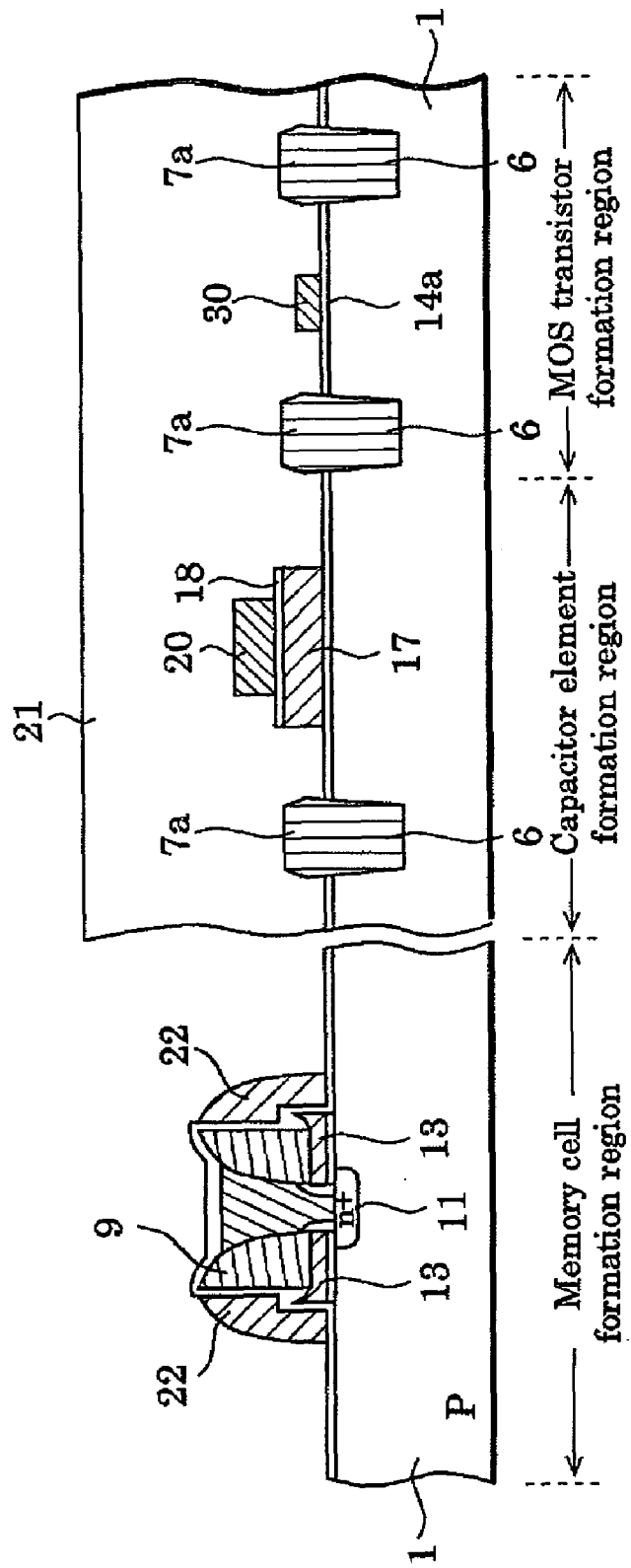
FIG. 10 is a cross-sectional view showing the semiconductor device manufacturing method of the second embodiment of the invention.

Then, as shown in FIG. 10, with the capacitor element formation region and the MOS transistor formation region covered with a photoresist layer 21, a polysilicon film 15 and a silicon nitride film 16 remaining in the memory cell formation region are etched back by anisotropic etching, so that the control gates 22 are formed. The control gates 22 are formed by self-alignment on sidewalls of the spacer films 9. That is, the control gates 22 are formed on the sidewalls of the spacer films 9 and on the P-type silicon substrate 1 to be channel regions.

Figure 11:
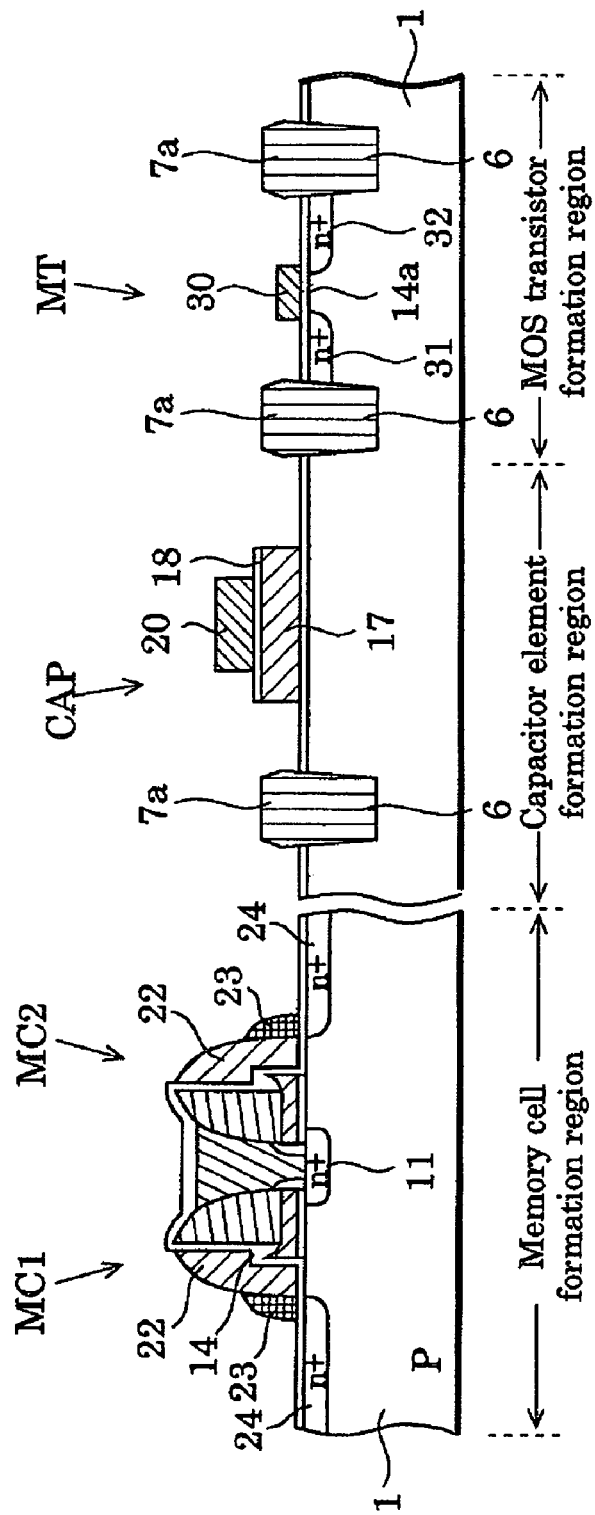
FIG. 11 is a cross-sectional view showing the semiconductor device manufacturing method of the second embodiment of the invention.
Figure 12:
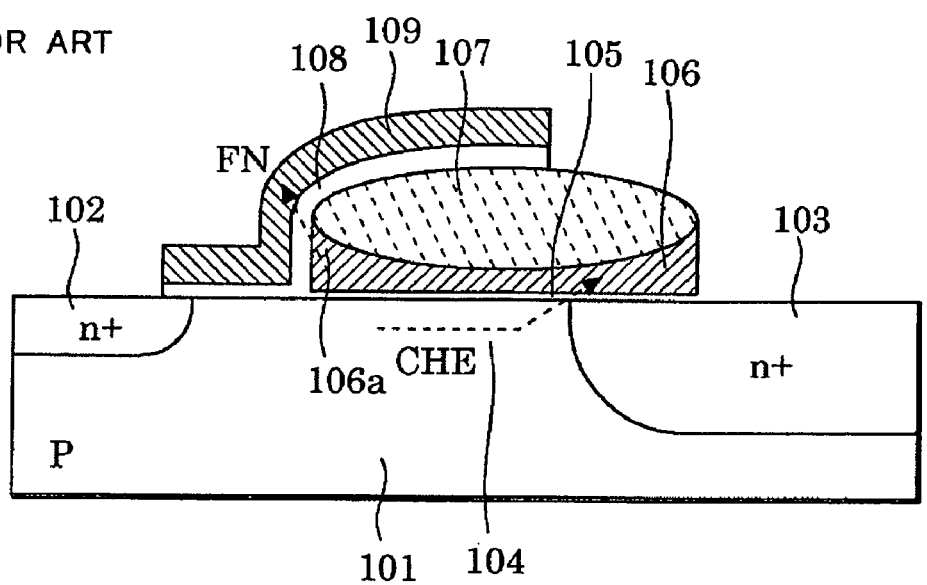
FIG. 12 is a cross-sectional view showing a structure of a memory cell of a split-gate type EEPROM of a conventional art.
Figure 13:
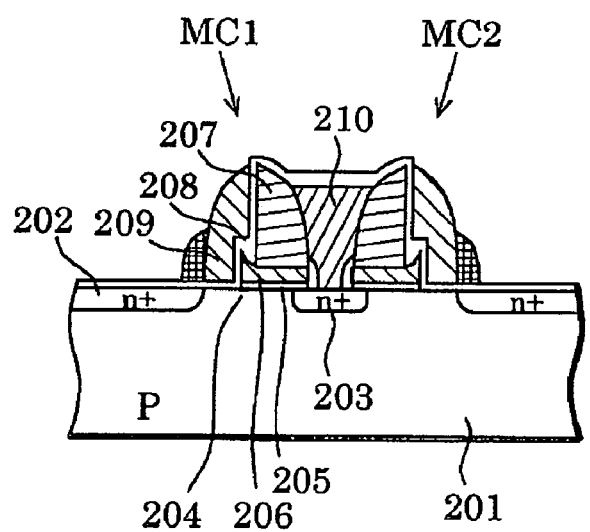
FIG. 13 is a cross-sectional view showing a structure of a memory cell of a split-gate type EEPROM of a self-alignment type of a conventional art.

Next, as shown in FIG. 11, after the photoresist layer 21 is removed, mini spacer films 23 are formed on lower portions of sidewalls of the control gates 22. These mini spacer films 23 can be formed by depositing a silicon oxide film by a CVD method and etching back the silicon oxide film. Then, n-type impurities (e.g., arsenic) are ion-injected into this memory cell formation region to form n+ drain regions 24 by self-alignment to the control gates 22. A front surface of the P-type silicon substrate 1 between a source region 11 and the drain regions 24 is to be the channel regions.

Furthermore, n-type impurities (e.g., arsenic) are ion-injected into the MOS transistor formation region, too, so that a n+ source region 31 and a n+ drain region 32 of a MOS transistor MT are formed. Alternatively, the ion-injection for forming the drain regions 24 of the memory cells and the ion-injection for forming the source region 31 and the drain regions 32 of the MOS transistor MT can be combined in a same ion-injection process.

In this embodiment, the pair of left and right memory cells MC1 and MC2 is formed in the memory cell formation region of the P-type silicon substrate 1, being symmetrical to each other with respect to the source region 11. The capacitor element CAP formed of the lower electrode 17, the capacitor insulation film 18, and the upper electrode 20 is formed in the capacitor element formation region of the same P-type silicon substrate 1. Furthermore, the MOS transistor MT is formed on the same P-type silicon substrate 1. Since the gate electrode 30 of the MOS transistor MT is formed at the same time as when the upper electrode 20 of the capacitor element CAP is formed, the process can be commonly utilized more than the process of the first embodiment, so that the manufacturing process can be reduced.

What is claimed is:

1. A method of manufacturing a semiconductor device, comprising:
    forming a floating gate on a semiconductor substrate so that the floating gate is insulated from the semiconductor substrate by a first insulation film;
    forming a tunnel insulation film to cover part of the floating gate and part of the semiconductor substrate;
    forming a first semiconductor film to cover the tunnel insulation film;
    forming a second insulation film to cover the first semiconductor film;
    etching the first semiconductor film and the second insulation film so as to form a lower electrode of a capacitor element and a capacitor insulation film disposed on the lower electrode and to keep the floating gate covered by the first semiconductor film;
    forming a second semiconductor film to cover the capacitor insulation film and part of the semiconductor substrate;
    etching the second semiconductor film so as to form an upper electrode disposed on the capacitor insulation film; and
    etching the first semiconductor film covering the floating gate electrode to form a control gate.

2. The method of claim 1, wherein the etching of the second semiconductor film is performed so that a gate electrode of a MOS transistor is formed on the semiconductor substrate when the upper electrode is formed.

3. The method of claim 1, wherein the of forming of the floating gate comprises;
    forming a third semiconductor film on the first insulation film,
    forming a mask layer on the third semiconductor film,
    forming an opening in the mask layer to expose the third semiconductor film,
    etching the third semiconductor film using the mask layer as a mask so that an undercut is formed under an edge of the opening,
    forming a spacer film around the edge of the opening so that the under cut is filled with the spacer film,
    etching the third semiconductor film and the first insulation film to expose the semiconductor substrate using the spacer film as a mask,
    removing the mask layer so as to leave the spacer film on the third semiconductor film, and
    etching the third semiconductor layer to form the floating gate using the spacer film left on the third semiconductor film as a mask.

4. The method of claim 3, wherein the mask layer comprises a silicon nitride film.

5. The method of claim 1, wherein each of the first and second semiconductor films comprises a polysilicon film.

6. The method of claim 1, wherein each of the first and second insulation films comprises a silicon oxide film or a silicon nitride film.

* * * * *